United States Patent
Liang et al.

(10) Patent No.: US 12,453,046 B2
(45) Date of Patent: Oct. 21, 2025

(54) SYSTEMS FOR THERMAL MANAGEMENT OF AN ELECTRONIC DEVICE

(71) Applicant: Dana Canada Corporation, Oakville (CA)

(72) Inventors: Jingyuan Liang, Toronto (CA); Andrei Catuneanu, Oakville (CA); Matthew S. Birkett, Toronto (CA)

(73) Assignee: DANA CANADA CORPORATION, Oakville (CA)

( * ) Notice: Subject to any disclaimer, the term of this patent is extended or adjusted under 35 U.S.C. 154(b) by 237 days.

(21) Appl. No.: 18/047,860

(22) Filed: Oct. 19, 2022

(65) Prior Publication Data

US 2024/0138107 A1  Apr. 25, 2024
US 2024/0237280 A9  Jul. 11, 2024

(51) Int. Cl.
*H05K 7/20* (2006.01)
*H05K 1/02* (2006.01)

(52) U.S. Cl.
CPC ....... *H05K 7/20272* (2013.01); *H05K 1/0201* (2013.01)

(58) Field of Classification Search
CPC .......... H05K 1/0201–0212; H05K 1/181–182; H05K 1/0271–272; H05K 7/20254; H05K 7/20272; H05K 7/20872; H05K 7/20927; H05K 7/20309; H05K 7/20318; H05K 7/20336; H05K 2201/06; H05K 2201/10166; H01L 21/4803; H01L 21/4882; H01L 23/3121; H01L 23/34; H01L 23/36–3675; H01L 23/46; H01L 23/50; H01L 23/4006; H01L 23/4735; H01L 23/492; H01L 25/072; H01L 25/18; H01L 25/50
See application file for complete search history.

(56) References Cited

U.S. PATENT DOCUMENTS

| | | | |
|---|---|---|---|
| 5,504,378 A * | 4/1996 | Lindberg | H05K 7/20927 361/699 |
| 5,835,349 A | 11/1998 | Giannatto et al. | |
| 7,215,545 B1 * | 5/2007 | Moghaddam | H01L 23/3732 361/708 |
| 7,643,296 B2 | 1/2010 | Yamada et al. | |
| 8,730,673 B2 * | 5/2014 | Vos | H05K 1/0272 257/714 |
| 9,681,558 B2 | 6/2017 | Chen et al. | |

(Continued)

FOREIGN PATENT DOCUMENTS

CN  112361851 A  2/2021

OTHER PUBLICATIONS

Liang, Z. et al., "Integrated Packaging of a 1 kW Switching Module Using a Novel Planar Integration Technology," IEEE Transactions on Power Electronics, vol. 19, No. 1, Jan. 2004, 9 pages.

(Continued)

*Primary Examiner* — Amir A Jalali
(74) *Attorney, Agent, or Firm* — McCoy Russell LLP

(57) ABSTRACT

Systems are provided for a cooling system for an electric device. In one example, a system includes a metallic plate coupled to a circuit board and a coolant manifold. The coolant manifold comprises a semi-open coolant channel configured to flow coolant in contact with the metallic plate.

20 Claims, 5 Drawing Sheets

(56) References Cited

U.S. PATENT DOCUMENTS

| | | | |
|---|---|---|---|
| 10,242,969 B2 | 3/2019 | Hohlfeld | |
| 2007/0159797 A1 | 7/2007 | Teneketges et al. | |
| 2009/0284921 A1* | 11/2009 | Colgan | H01L 23/473 361/699 |
| 2013/0258592 A1* | 10/2013 | Brandenburg | H05K 7/20927 361/699 |
| 2016/0050768 A1 | 2/2016 | Chen et al. | |
| 2019/0182993 A1* | 6/2019 | Tokuyama | H05K 7/20927 |
| 2020/0211927 A1 | 7/2020 | Wan et al. | |
| 2022/0201837 A1 | 6/2022 | Hou et al. | |
| 2022/0210905 A1 | 6/2022 | Choi et al. | |
| 2023/0022829 A1* | 1/2023 | Zhou | H01L 23/3735 |
| 2023/0335452 A1* | 10/2023 | Yamada | H01L 21/56 |
| 2024/0090119 A1* | 3/2024 | Birkett | H05K 3/1291 |
| 2024/0118042 A1* | 4/2024 | Hermida | H01L 23/473 |

OTHER PUBLICATIONS

Yang, Y. et al., "Automotive Power Module Packaging: Current Status and Future Trends," IEEE Access, vol. 8, Aug. 27, 2020, 19 pages.

"P² Pack Embedding Efficient Embedding of Power Semiconductors Into PCBS," Schweizer Website, Available Online at https://schweizer.ag/en/technologies-solutions/pcb-technologies/semiconductor-embedding-systems/p2-pack, Available as Early as Apr. 16, 2021, 5 pages.

* cited by examiner

SYSTEMS FOR THERMAL MANAGEMENT OF AN ELECTRONIC DEVICE

TECHNICAL FIELD

The present description relates generally to a cooling system of an electronic components of an electronic device.

BACKGROUND AND SUMMARY

Vehicles may include a plurality of components that demand cooling for optimal efficiency. For example, power control systems may demand cooling along with auxiliary components thereof. In one example, a power module of an electric vehicle traction inverter or low voltage inverter in auxiliary motor applications may demand cooling for enhanced operation. In addition to transistors in the power module, peripheral components in the inverter, such as filtering capacitors and inductors, also demand cooling to achieve a desired performance threshold.

Meeting cooling demands of these components may result in compromises in packaging and layout. Compromises may include an increase in inverter volume and additional wiring/integrating components. This may lead to a decrease in power density and an increase in waste heat losses. There is a demand for more efficient, higher power density inverters with a compact package.

In one example, the issues described above may be at least partially solved by a metallic plate, a printed-circuit-board (PCB) mounted on a first side of the metallic plate with a dielectric isolation layer separating the PCB from the metallic plate, and a semi-open coolant manifold directly mounted to a second side of the metallic plate, the second side opposite the first side. By integrating the power system with its peripheral components and a heat exchanger in a compact package, a higher power density, a superior cooling, and a greater overall inverter efficiency may be achieved.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

BRIEF DESCRIPTION OF THE FIGURES

The above, as well as other advantages of the present disclosure, will become readily apparent to those skilled in the art from the following detailed description when considered in light of the accompanying drawings in which.

DETAILED DESCRIPTION

Figure 1:
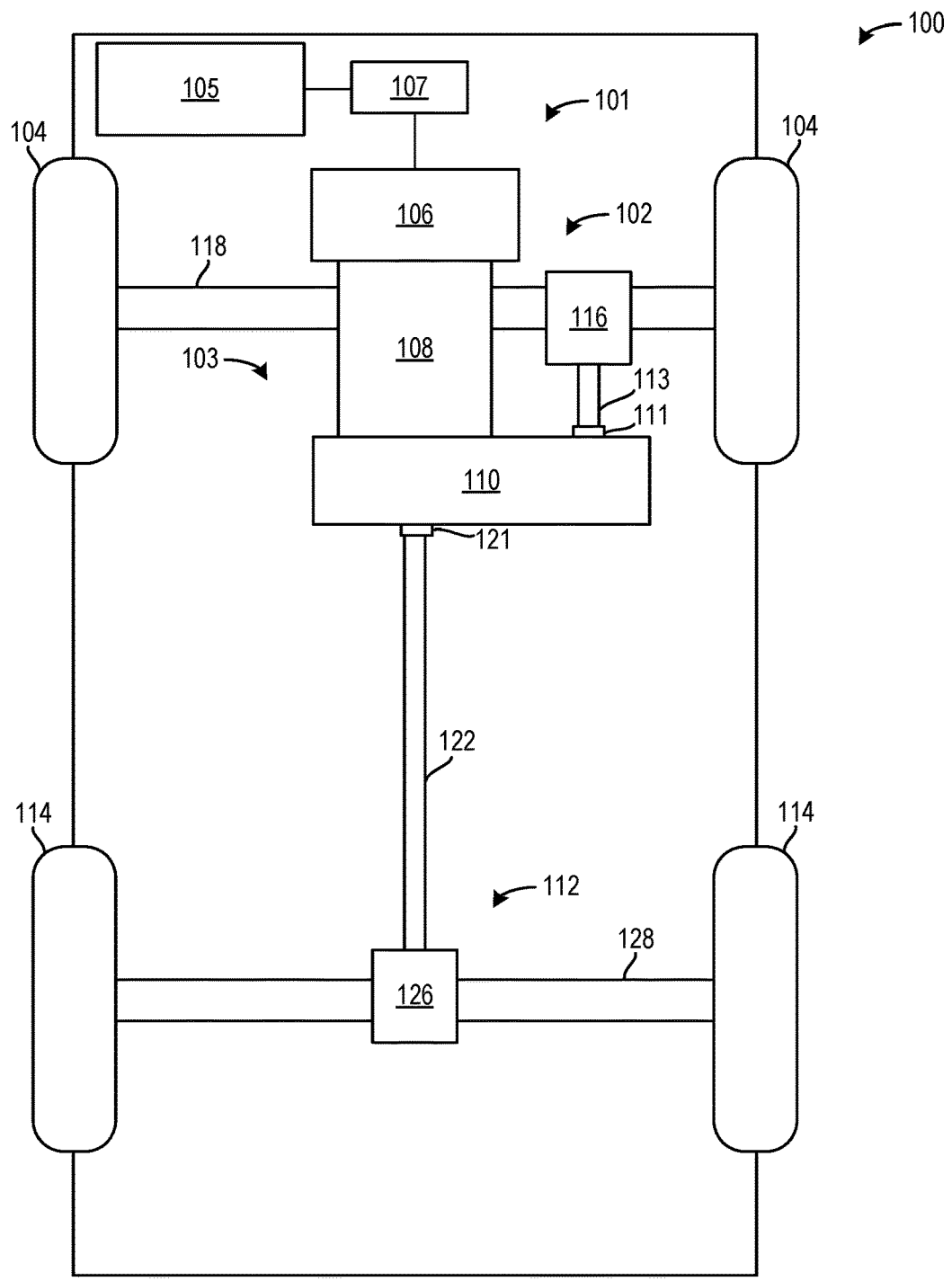
FIG. 1 is a schematic depiction of an example vehicle powertrain according to an embodiment.

The following description relates to a system for a cooling system of a vehicle. In one example, the vehicle comprises an electric drive unit comprising an inverter, electric motor, gearbox, and the like, as shown in FIG. 1. The cooling system may be integrally arranged with a power control module of the inverter, as shown in FIGS. 2-5.

Figure 2:
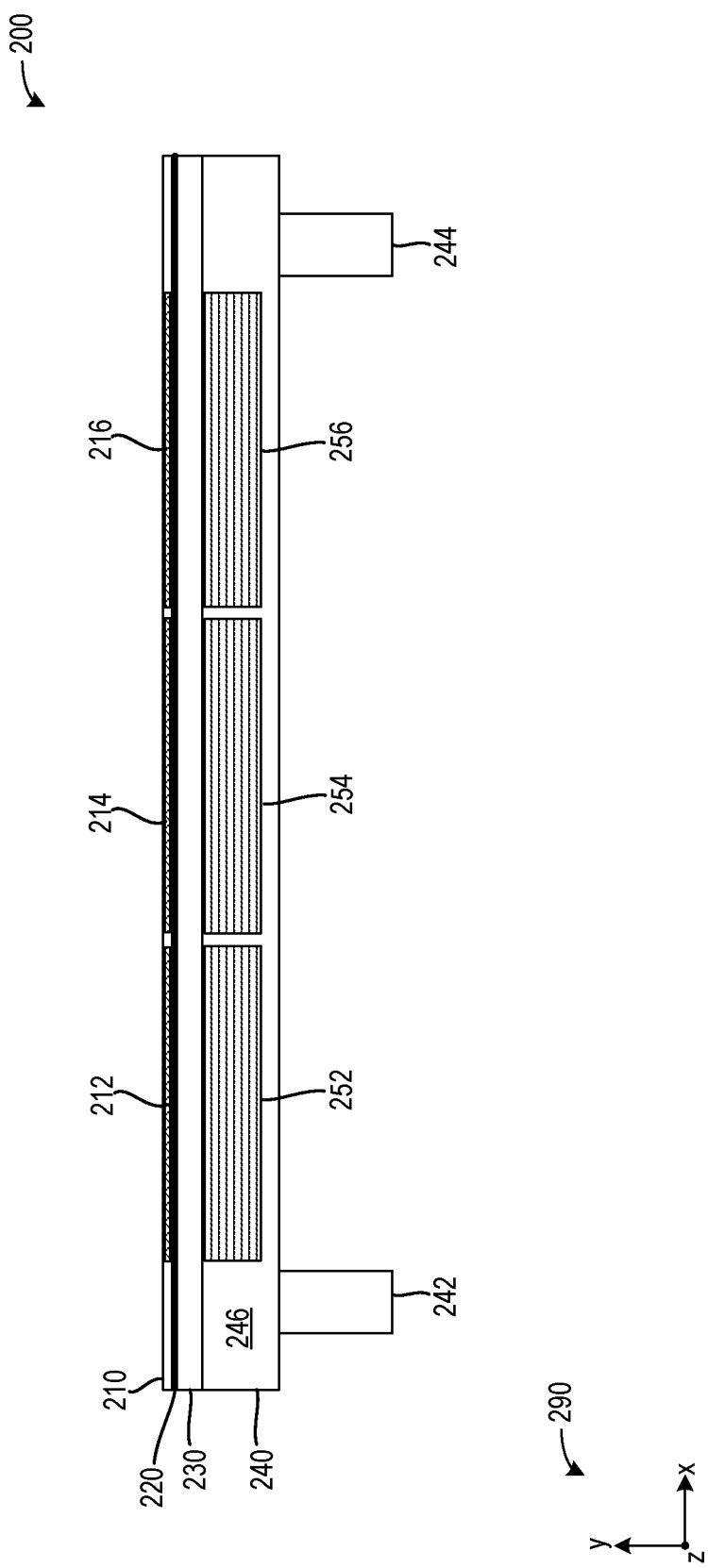
FIG. 2 is an embodiment of a cooling system integrally coupled to a power control system according to an embodiment.
Figure 3:
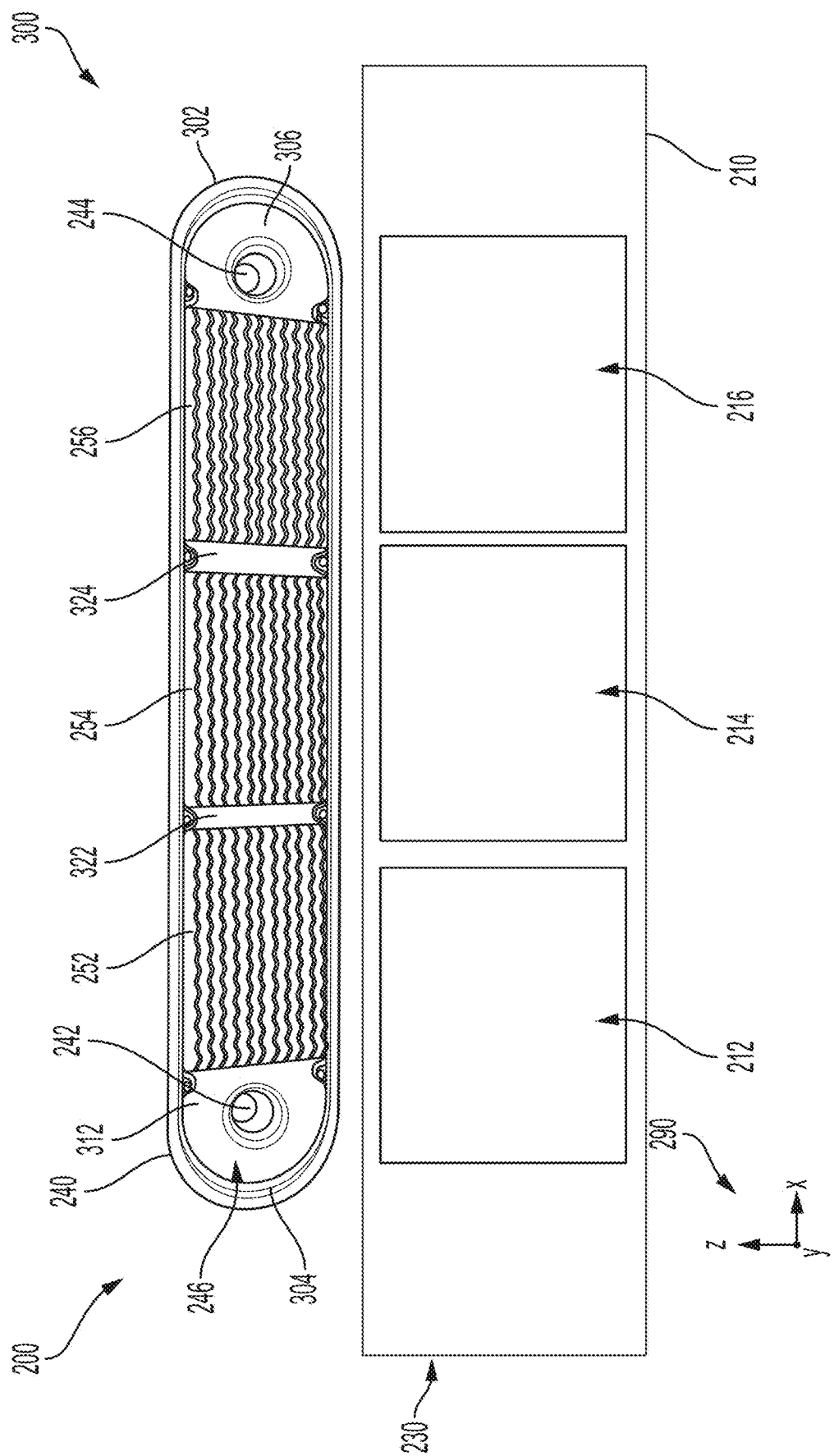
FIG. 3 is an exploded view of the power control system and the cooling system according to an embodiment.
Figure 4:
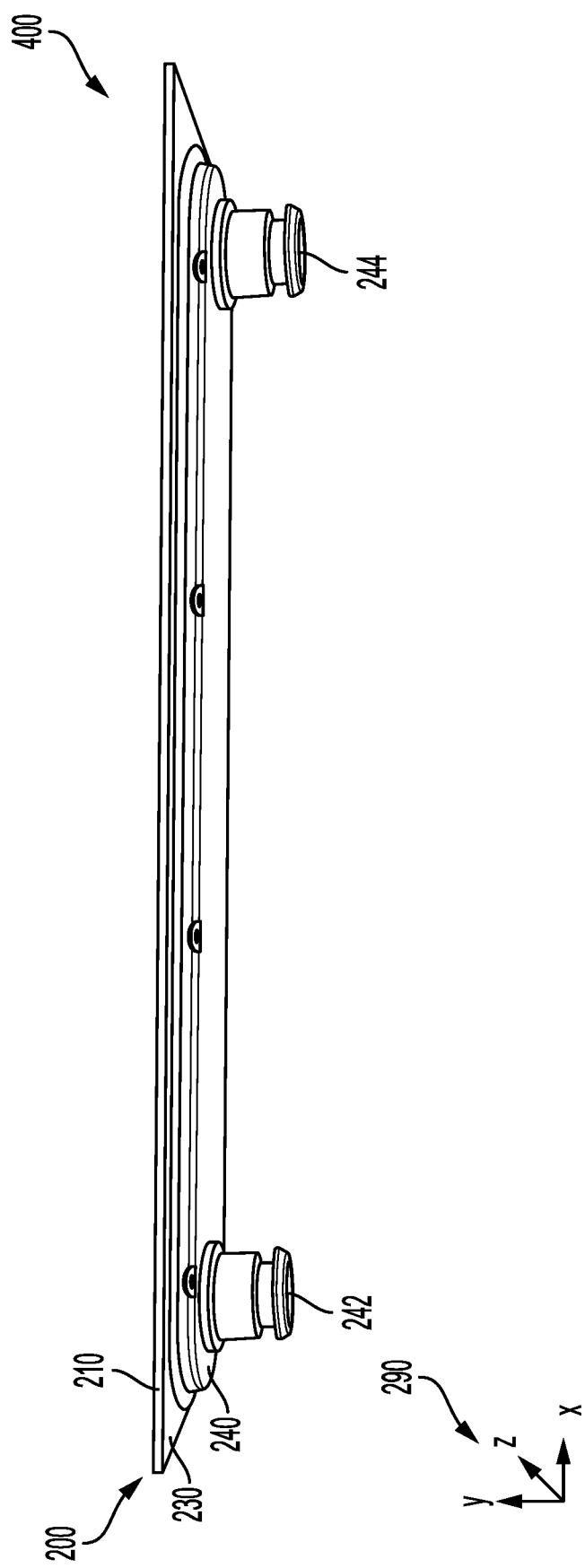
FIG. 4 is a perspective view of the power control system and the cooling system according to an embodiment.
Figure 5:
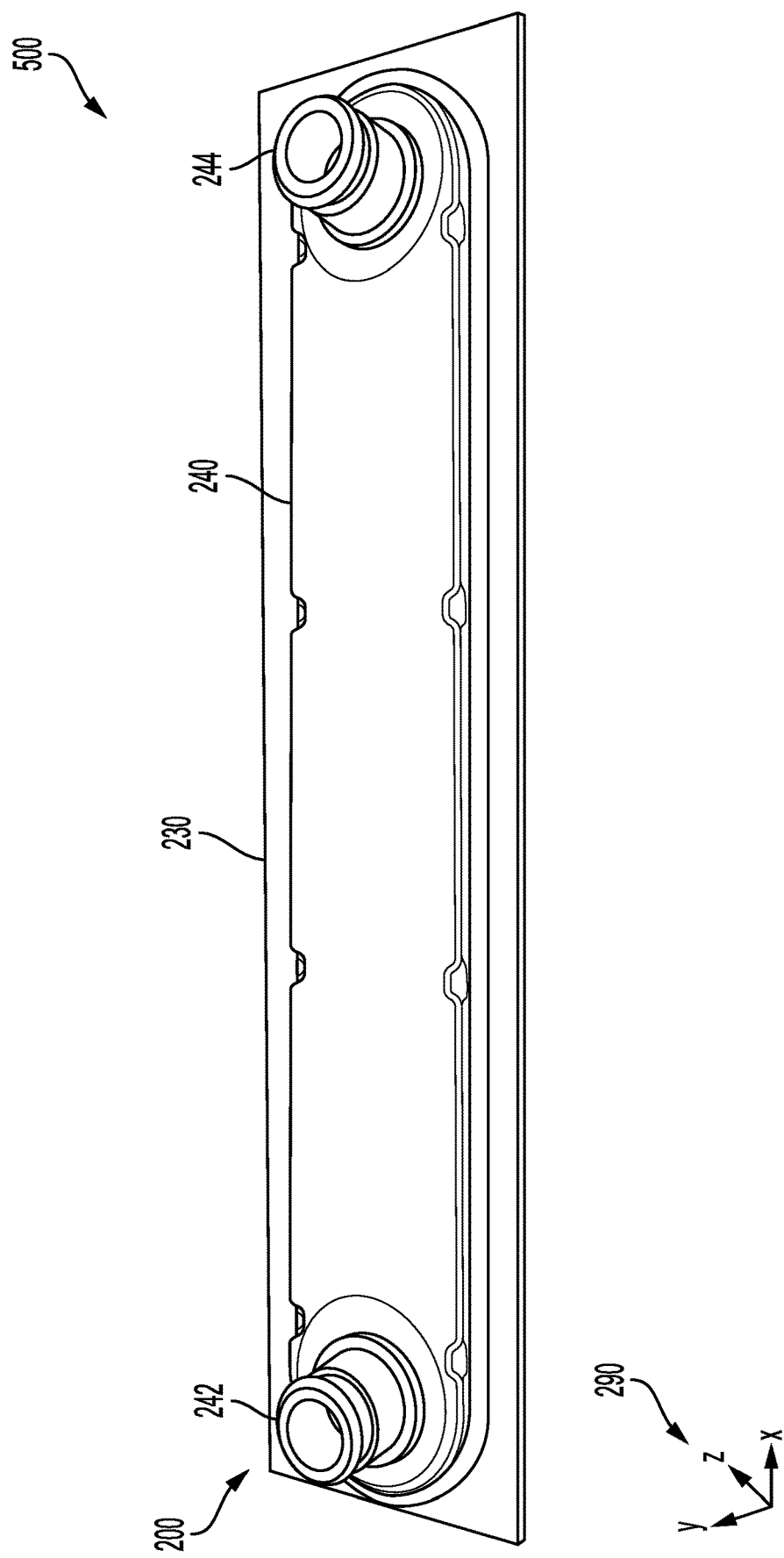
FIG. 5 is a face-on view of the power control system and the cooling system according to an embodiment.

FIGS. 1-5 show example configurations with relative positioning of the various components. If shown directly contacting each other, or directly coupled, then such elements may be referred to as directly contacting or directly coupled, respectively, at least in one example. Similarly, elements shown contiguous or adjacent to one another may be contiguous or adjacent to each other, respectively, at least in one example. As an example, components laying in face-sharing contact with each other may be referred to as in face-sharing contact. As another example, elements positioned apart from each other with only a space therebetween and no other components may be referred to as such, in at least one example. As yet another example, elements shown above/below one another, at opposite sides to one another, or to the left/right of one another may be referred to as such, relative to one another. Further, as shown in the figures, a topmost element or point of element may be referred to as a "top" of the component and a bottommost element or point of the element may be referred to as a "bottom" of the component, in at least one example. As used herein, top/bottom, upper/lower, above/below, may be relative to a vertical axis of the figures and used to describe positioning of elements of the figures relative to one another. As such, elements shown above other elements are positioned vertically above the other elements, in one example. As yet another example, shapes of the elements depicted within the figures may be referred to as having those shapes (e.g., such as being circular, straight, planar, curved, rounded, chamfered, angled, or the like). Further, elements shown intersecting one another may be referred to as intersecting elements or intersecting one another, in at least one example. Further still, an element shown within another element or shown outside of another element may be referred as such, in one example. It will be appreciated that one or more components referred to as being "substantially similar and/or identical" differ from one another according to manufacturing tolerances (e.g., within 1-5% deviation). FIGS. 3-5 are shown approximately to scale, however, other dimensions may be used if desired.

Turning now to FIG. 1, a vehicle 100 is shown comprising a powertrain 101 and a drivetrain 103. The powertrain comprises a prime mover 106 and a transmission 108. The prime mover 106 may be an internal combustion engine or an electric motor, for example, and is operated to provide rotary power to the transmission 108. The transmission 108 may be any type of transmission, such as a manual transmission, an automatic transmission, or a continuously variable transmission. The transmission 108 receives the rotary power produced by the prime mover 106 as an input and outputs rotary power to the drivetrain 103 in accordance with a selected gear or setting.

The prime mover 106 may be powered via energy from an energy storage device 105. In one example, the energy storage device 105 is a battery configured to store electrical energy. An inverter 107 may be arranged between the energy storage device 105 and the prime mover 106 and configured to adjust direct current (DC) to alternating current (AC). The inverter 107 may include a variety of components and circuitry with thermal demands that effect an efficiency of the inverter. As will be described herein, the inverter 107 may include a cooling arrangement configured to meet the thermal demands of the components of the inverter 107 while decreasing a packaging size thereof. The cooling arrangement of the inverter 107 is described in greater detail with respect to FIGS. 2-5 herein.

The vehicle 100 may be a commercial vehicle, light, medium, or heavy duty vehicle, a passenger vehicle, an off-highway vehicle, and sport utility vehicle. Additionally or alternatively, the vehicle 100 and/or one or more of its components may be in industrial, locomotive, military, agricultural, and aerospace applications. In one example, the vehicle 100 is an electric vehicle.

In some examples, such as shown in FIG. 1, the drivetrain 103 includes a first axle assembly 102 and a second axle assembly 112. The first axle assembly 102 may be configured to drive a first set of wheels 104, and the second axle assembly 112 may be configured to drive a second set of wheels 114. In one example, the first axle assembly 102 is arranged near a front of the vehicle 100 and thereby comprises a front axle, and the second axle assembly 112 is arranged near a rear of the vehicle 100 and thereby comprises a rear axle. The drivetrain 103 is shown in a four-wheel drive configuration, although other configurations are possible. For example, the drivetrain 103 may include a front-wheel drive, a rear-wheel drive, or an all-wheel drive configuration. Further, the drivetrain 103 may include one or more tandem axle assemblies. As such, the drivetrain 103 may have other configurations without departing from the scope of this disclosure, and the configuration shown in FIG. 1 is provided for illustration, not limitation. Further, the vehicle 100 may include additional wheels that are not coupled to the drivetrain 103.

In some four-wheel drive configurations, such as shown in FIG. 1, the drivetrain 103 includes a transfer case 110 configured to receive rotary power output by the transmission 108. A first driveshaft 113 is drivingly coupled to a first output 111 of the transfer case 110, while a second driveshaft 122 is drivingly coupled to a second output 121 of the transfer case 110. The first driveshaft 113 (e.g., a front driveshaft) transmits rotary power from the transfer case 110 to a first differential 116 of the first axle assembly 102 to drive the first set of wheels 104, while the second driveshaft 122 (e.g., a rear driveshaft) transmits the rotary power from the transfer case 110 to a second differential 126 of the second axle assembly 112 to drive the second set of wheels 114. For example, the first differential 116 is drivingly coupled to a first set of axle shafts 118 coupled to the first set of wheels 104, and the second differential 126 is drivingly coupled to a second set of axle shafts 128 coupled to the second set of wheels 114. It may be appreciated that each of the first set of axle shafts 118 and the second set of axle shafts 128 may be positioned in a housing.

In some examples, additionally or alternatively, the vehicle 100 may be a hybrid vehicle including both an engine an electric machine each configured to supply power to one or more of the first axle assembly 102 and the second axle assembly 112. For example, one or both of the first axle assembly 102 and the second axle assembly 112 may be driven via power originating from the engine in a first operating mode where the electric machine is not operated to provide power (e.g., an engine-only mode), via power originating from the electric machine in a second operating mode where the engine is not operated to provide power (e.g., an electric-only mode), and via power originating from both the engine and the electric machine in a third operating mode (e.g., an electric assist mode). As another example, one or both of the first axle assembly 102 and the second axle assembly 112 may be an electric axle assembly configured to be driven by an integrated electric machine.

Turning now to FIG. 2, it shows an embodiment of a power management system 200. The power management system 200 may include a variety of elements configured for operating an inverter (e.g., inverter 107 of FIG. 1) of a powertrain (e.g., powertrain 101 of FIG. 1). The power management system 200 may include a circuit board 210, a dielectric isolation layer 220, a metallic plate 230, and a coolant manifold 240.

An axis system 290 is shown including three axes, namely an x-axis parallel to a horizontal direction, a y-axis parallel to a vertical direction, and a z-axis normal to each of the x- and y-axes.

The circuit board 210 may include one or more circuits configured to control various operations. More specifically, the circuit board 210 may be a printed circuit board (PCB) including embedded integrated circuits comprising a first circuit 212, a second circuit 214, and a third circuit 216. Each of the circuits may be configured to control different systems while being arranged along a common plane. In one example, the first circuit 212 may be a transistor switching circuit, the second circuit 214 may be a gate driver board circuit, and the third circuit 216 may be a filtering capacitor/inductor circuit. Each of the first circuit 212, the second circuit 214, and the third circuit 216 may include a semiconductor transistor embedded into the circuit board 210 in the common plane. In some examples, additionally or alternatively, each of the first circuit 212, the second circuit 214, and the third circuit 216 may include switching current transistors to facilitate the conversion of energy between direct current (DC) and alternating current (AC). The number of circuits may be adjusted to match a phase of motors used. For example, the embodiment of FIG. 2 may be used with a three-phase motor. A power management system with six circuits may be used with a six phase motor. Gate driver boards, filtering capacitors/inductors may be found in one or more of the three circuits in addition to the transistors.

The circuit board 210 may be coupled to the metallic plate 230 with the dielectric isolation layer 220 arranged therebetween. In one example, the combination of the circuit board 210, the dielectric isolation layer 220, and the metallic plate 230 may form an integrated single piece.

The metallic plate 230 may include a uniform height measured along the y-axis. The metallic plate 230 may be a solid piece of a single metal or an alloy. In some embodiments, the metallic plate 230 may include one or more passages, fins, or other features configured to increase a thermal transfer between the circuit board 210 and coolant of the coolant manifold 240.

The coolant manifold 240 may be coupled to a second side of the metallic plate 230, the second side opposite a first side to which the circuit board 210 is coupled. The coolant manifold 240 may include a coolant inlet 242 at a first end of the coolant manifold 240 and a coolant outlet 244 at a second end of the coolant manifold, the second end opposite the first end. The coolant inlet 242 may direct coolant into an interior volume 246 of the coolant manifold 240. The coolant outlet 244 may direct coolant out of the interior volume 246 of the coolant manifold 240. In one example, the coolant outlet 244 may expel coolant to a coolant system of a prime mover (e.g., prime mover 106 of FIG. 1). The coolant inlet and outlet may be coupled to a coolant assembly coupled to auxiliary components of the inverter system, such as filtering capacitors and inductors.

The interior volume 246 of the coolant manifold 240 may be at least partially open. In one example, the interior volume 246 flows coolant from the coolant inlet 242 to the coolant outlet 244 in direct contact with the metallic plate 230. In some embodiments, such as in embodiments where the metallic plate 230 includes heat pipes or vapor chambers, coolant may flow closer to the circuit board 210, such as in contact with the first side, which may enhance thermal efficiency.

The interior volume 246 may be shaped as a semi-open coolant channel including a plurality of heat transfer surfaces. The heat transfer surfaces may include fins, dimples, protrusions, grooves, or other deviations from smooth to increase a surface area between it and the circuit board 210. The heat transfer surfaces may extend toward the second side of the metallic plate 230. In one example, the heat transfer surfaces may be divided into sections aligned with the circuits. More specifically, a first surface 252 may be aligned with the first circuit 212 along the y-axis. A second surface 254 may be aligned with the second circuit 214 along the y-axis. A third surface 256 may be aligned with the third circuit 216 along the y-axis. Gaps between the heat transfer surfaces may be aligned with gaps between the circuits.

In one example, the power management system 200, including the circuit board 210, the dielectric isolation layer 220, the metallic plate 230, and the coolant manifold 240 may be manufactured via laminating the circuit board 210 onto the metallic plate 230 with the dielectric isolation layer 220 arranged therebetween. The dielectric isolation layer 220 separates the metallic plate 230 from the circuit board 210. Lamination results in a single, solid, integrated component with an order in the y-direction including the metallic plate 230, the dielectric isolation layer 220, and the circuit board 210.

The circuit board 210 may be terminated in (e.g., connected to) the metallic plate 230, which may be a copper plate of desired thickness. The thickness may be based on a thermal demand of the circuit board 210, in one example. In one example, the copper plate is less than 5 mm thick. In one example, the copper plate is exactly 2 mm thick. Additionally or alternatively, different material plates may be used. For example, the circuit board 210 may be terminated onto an aluminum, ceramic, plastic, or other material configured to desirably terminate the circuit board 210. Terminating the circuit board 210 may include an electro/electroless plating with nickel, silver, gold, or other suitable element. Desirable termination may further include allowing the coupling between the circuit board and the metallic plate via soldering, sintering, epoxy, or other suitable method.

The coolant manifold 240 is in direct contact with the metallic plate 230. In one example, the coolant manifold 240 is hermetically sealed to the metallic plate 230. In one example, a solder paste may be used to physically couple and hermetically seal the coolant manifold 240 to the metallic plate 230. Soldering may be desired to couple the metallic plate 230 and the coolant manifold 240 due to its low temperature that does not degrade the circuit board 210. The coolant manifold 240 may include one or more materials including aluminum, copper, ceramic, plastic, and the like. In some embodiments, additionally or alternatively, the coolant manifold 240 may be a contiguous formed plate with heat transfer features arranged throughout with a positioning independent of the circuit board 210. This may decrease a manufacturing cost and time relative to the heat transfer surfaces including the fins described above.

In some embodiments, surface components of the circuit board 210 may be soldered onto the circuit board 210 in a final step (e.g., following coupling of the circuit board 210 and the coolant manifold 240 to the metallic plate 230). In alternative embodiments, additionally or alternatively, the surface components may be silver sintered onto the circuit board 210 that is laminated to the metallic plate 230 prior to coupling the coolant manifold 240 to the metallic plate 230.

Turning now to FIG. 3, it shows an exploded view 300 of the power management system 200. As such, components previously introduced may be similarly numbered in this figure and subsequent figures. The exploded view 300 illustrates the interior volume 246 which is shaped via an outer rim 302. The outer rim 302 may be the only portion of the coolant manifold in face-sharing contact with the metallic plate 230. A side wall 304 may extend from the outer rim 302 to a back wall 306. The interior volume 246 may be equal to a dimension of the side wall 304 and the back wall 306.

The side wall 304 may include two curved portions coupled to two linear portions. The interior volume 246 may include an inlet volume 312 fluidly coupled to the inlet 242. The inlet volume 312 may include a partially circular shape. More specifically, the inlet volume 312 is adjacent to an entirety of one of the curved portions of the side wall 304 and to a portion of one of the linear portions of the side wall 304 adjacent to the first surface 252.

The first surface 252 may be raised relative to the back wall 306. The first surface 252 may include fins comprising a sinusoidal shape extending in a direction parallel to the linear portion. Each of the second surface 254 and the third surface 256 may include identical fins to the first surface. In one example, the fins protrude from the back wall 306 toward the second side of the metallic plate 230. The fins may include other shapes, sizes and patterns for enhancing heat transfer.

A first gap 322 may be arranged between the first surface 252 and the second surface 254. The first gap 322 may be free of fins such that there is a discontinuity between adjacent fins. In one example, the first gap 322 is recessed relative to the fins. A second gap 324 may be arranged between the second surface 254 and the third surface 256. The second gap 324 may be substantially identical to the first gap 322 in size and shape. In some examples, additionally or alternatively, a shape of the second gap 324 may be different than a shape of the first gap 322. For example, the second gap 324 may be larger than the first gap 322. In some embodiments, additionally or alternatively, one or more of the first gap 322 and the second gap 324 may be omitted and the surfaces may be continuous with one another.

Turning now to FIGS. 4 and 5, they show a perspective view 400 and a face-on view 500 of the power management system 200, respectively. The inlet 242 and the outlet 244 may have a tubular shape. Each of the inlet 242 and the outlet 244 may be shaped to receive a hose or similar device for conducting coolant in and out of the interior volume of the coolant manifold 240. A size of the coolant manifold 240 may be less than a size of the metallic plate 230. For example, a width of the coolant manifold 240 may be less than a width of the metallic plate 230; a length of the coolant manifold 240 may be less than a length of the metallic plate 230; and/or a thickness of the coolant manifold 240 may be greater than a thickness of the metallic plate 230. As such, the metallic plate 230 may include overhangs and/or excess materials relative to the coolant manifold 240. The positioning of the coolant manifold 240 may be based on a position of the circuits on the circuit board 210. In some examples, a size of the coolant manifold 240 may be equal to the size of the metallic plate 230. In one example, additionally or alternatively, a gauge of the metal plate 230 may be greater than a gauge of the coolant manifold 240.

The disclosure provides support for a system including a metallic plate, a printed-circuit-board (PCB) mounted on a first side of the metallic plate with a dielectric isolation layer separating the PCB from the metallic plate, and a semi-open coolant manifold directly mounted to a second side of the metallic plate, the second side opposite the first side. A first example of the system further includes where the PCB is planar. A second example of the system, optionally including the first example, further includes where embedded integrated circuits of the PCB include one or more of a switching circuit, a gate driver circuit, a filtering capacitor circuit, and an inductor circuit. A third example of the system, optionally including one or more of the previous examples, further includes where the coolant manifold comprises an interior volume configured to receive coolant from an inlet and flow the coolant to an outlet. A fourth example of the system, optionally including one or more of the previous examples, further includes where coolant in the interior volume contacts the metallic plate. A fifth example of the system, optionally including one or more of the previous examples, further includes where the interior volume comprises fins arranged therein. A sixth example of the system, optionally including one or more of the previous examples, further includes where the fins comprise a sinusoidal shape. A seventh example of the system, optionally including one or more of the previous examples, further includes where gaps are arranged between adjacent fins. An eighth example of the system, optionally including one or more of the previous examples, further includes where the PCB is laminated to the metallic plate and the coolant manifold is soldered to the metallic plate.

The disclosure further provides support for a power management system including a printed circuit board (PCB) laminated to a first side of a metallic plate and a coolant manifold hermetically sealed to a second side of the metallic plate, the second side opposite the first side, wherein the coolant manifold comprises a semi-open coolant passage configured to flow coolant in direct contact with the second side of the metallic plate. A first example of the power management system further includes where the semi-open coolant passage is shaped via an outer rim, a side wall, and a back wall of the coolant manifold. A second example of the power management system, optionally including the first example, further includes where only the outer rim is in face-sharing contact with the second side of the metallic plate. A third example of the power management system, optionally including one or more of the previous examples, further includes where a plurality of surface features protrudes from the back wall toward the metallic plate. A fourth example of the power management system, optionally including one or more of the previous examples, further includes where the coolant manifold comprises an inlet adjacent to a first end and an outlet adjacent to a second end opposite the first end. A fifth example of the power management system, optionally including one or more of the previous examples, further includes where the metallic plate blocks coolant flow directly to the PCB.

The disclosure provides additional support for a cooling arrangement including a printed circuit board (PCB) arranged in a common plane, a metallic plate comprising a first side to which the PCB is laminated, and a coolant manifold comprising a semi-open coolant channel open to a second side of the metallic plate, wherein an outer rim of the coolant manifold is hermetically sealed to the second side. A first example of the cooling arrangement further includes where the semi-open coolant channel comprises sinusoidal fins. A second example of the cooling arrangement, optionally including the first example, further includes where a dielectric isolation layer arranged between the PCB and the metallic plate. A third example of the cooling arrangement, optionally including one or more of the previous examples, further includes where the cooling arrangement is arranged in an inverter of an electric vehicle. A fourth example of the cooling arrangement, optionally including one or more of the previous examples, further includes where the coolant manifold comprises an inlet at a first end of the coolant manifold and an outlet at a second end of the coolant manifold, the second end opposite the first end.

As used herein, the term "approximately" is construed to mean plus or minus five percent of the range unless otherwise specified.

The following claims particularly point out certain combinations and sub-combinations regarded as novel and non-obvious. These claims may refer to "an" element or "a first" element or the equivalent thereof. Such claims should be understood to include incorporation of one or more such elements, neither requiring nor excluding two or more such elements. Other combinations and sub-combinations of the disclosed features, functions, elements, and/or properties may be claimed through amendment of the present claims or through presentation of new claims in this or a related application. Such claims, whether broader, narrower, equal, or different in scope to the original claims, also are regarded as included within the subject matter of the present disclosure.

The invention claimed is:

1. A system, comprising:
a metallic plate;
a printed-circuit-board (PCB) including embedded integrated circuits, wherein the PCB is mounted on a first side of the metallic plate;
a dielectric isolation layer separating the PCB from the metallic plate and directly coupled to and in face-sharing contact with the PCB and the metallic plate, wherein the dielectric isolation layer is positioned to be between the embedded integrated circuits and the metallic plate; and
a semi-open coolant manifold directly mounted to a second side of the metallic plate, the second side opposite the first side.

2. The system of claim 1, wherein the PCB is planar.

3. The system of claim 1, wherein the embedded integrated circuits of the PCB include one or more of a switching circuit, a gate driver circuit, a filtering capacitor circuit, and an inductor circuit.

4. The system of claim 1, wherein the coolant manifold comprises an interior volume configured to receive coolant from an inlet and flow the coolant to an outlet, and wherein the coolant in the interior volume contacts the metallic plate.

5. The system of claim 4, wherein the interior volume comprises fins arranged therein, and wherein the fins comprise a sinusoidal shape.

6. The system of claim 5, wherein gaps are arranged between adjacent fins, and wherein the gaps are free of fins to cause a discontinuity in a horizontal and a vertical direction between adjacent fins.

7. The system of claim 1, wherein the PCB is laminated to the metallic plate and the coolant manifold is soldered to the metallic plate.

8. The system of claim 1, wherein the dielectric layer is a single planar layer including an upper surface in face sharing contact with the PCB and a bottom surface in face sharing contact with the metallic plate, and wherein the metallic plate is a single metallic planar layer including an upper surface in face sharing contact with the bottom surface of the dielectric layer.

9. The system of claim 1, wherein the metallic plate is a single metallic plate and the only metallic plate.

10. A power management system, comprising: a printed circuit board (PCB) laminated to a first side of a metallic plate and a coolant manifold hermetically sealed to a second side of the metallic plate, the second side opposite the first side, wherein the coolant manifold comprises a semi-open coolant passage configured to flow coolant in direct contact with the second side of the metallic plate, and wherein the coolant manifold is smaller than the metallic plate in a horizontal direction and a direction perpendicular to the horizontal direction and the metallic plate overhangs the coolant manifold around a circumference of the coolant manifold, wherein a dielectric isolation layer separating the PCB from the metallic plate and directly coupled to and in face-sharing contact with the PCB and the metallic plate.

11. The power management system of claim 10, wherein the semi-open coolant passage is shaped via an outer rim, a side wall, and a back wall of the coolant manifold.

12. The power management system of claim 11, wherein only the outer rim is in face-sharing contact with the second side of the metallic plate.

13. The power management system of claim 11, wherein a plurality of surface features protrudes from the back wall toward the metallic plate.

14. The power management system of claim 10, wherein the coolant manifold comprises an inlet adjacent to a first end and an outlet adjacent to a second end opposite the first end.

15. The power management system of claim 10, wherein the metallic plate blocks the coolant flow directly to the PCB.

16. A cooling arrangement, comprising:
a printed circuit board (PCB) arranged in a common plane;
a dielectric isolation layer in face-sharing contact with the PCB;
a metallic plate comprising a first side in face-sharing contact with the dielectric isolation layer opposite the PCB to which the PCB and the dielectric isolation layer are laminated to from an integrated single piece, wherein a thickness of the metallic plate is less than 5 mm, and wherein the metallic plate is solid metal or an alloy; and
a coolant manifold comprising a semi-open coolant channel open to a second side of the metallic plate, wherein an outer rim of the coolant manifold is hermetically sealed to the second side.

17. The cooling arrangement of claim 16, wherein the semi-open coolant channel comprises sinusoidal fins.

18. The cooling arrangement of claim 16, further comprising the dielectric isolation layer arranged between the PCB and the metallic plate.

19. The cooling arrangement of claim 16, wherein the cooling arrangement is arranged in an inverter of an electric vehicle.

20. The cooling arrangement of claim 16, wherein the coolant manifold comprises an inlet at a first end of the coolant manifold and an outlet at a second end of the coolant manifold, the second end opposite the first end.

* * * * *